(12) United States Patent
Huang et al.

(10) Patent No.: US 8,772,860 B2
(45) Date of Patent: Jul. 8, 2014

(54) FINFET TRANSISTOR STRUCTURE AND METHOD FOR MAKING THE SAME

(75) Inventors: Rai-Min Huang, Taipei (TW);
Sheng-Huei Dai, Taitung County (TW);
Chen-Hua Tsai, Hsinchu County (TW);
Duan Quan Liao, Singapore (SG);
Yikun Chen, Singapore (SG); Xiao Zhong Zhu, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 175 days.

(21) Appl. No.: 13/116,018

(22) Filed: May 26, 2011

(65) Prior Publication Data

US 2012/0299099 A1    Nov. 29, 2012

(51) Int. Cl.
H01L 27/108    (2006.01)

(52) U.S. Cl.
CPC .... H01L 27/10879 (2013.01); H01L 27/10826 (2013.01)
USPC .................................. 257/327; 257/E21.442

(58) Field of Classification Search
CPC ..................... H01L 27/10879; H01L 27/10826
USPC ............................................ 257/327, E21.442
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,538,386 B2* | 5/2009 | Jang .............................. | 257/327 |
| 7,569,857 B2 | 8/2009 | Simon | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0214231 A1* | 9/2006 | Shah et al. .................... | 257/347 |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |

* cited by examiner

*Primary Examiner* — Amar Movva
(74) *Attorney, Agent, or Firm* — Winston Hsu; Scott Margo

(57) ABSTRACT

A FINFET transistor structure includes a substrate, a fin structure, an insulating layer and a gate structure. The fin structure is disposed on the substrate and directly connected to the substrate. Besides, the fin structure includes a fin conductive layer and a bottle neck. The insulating layer covers the substrate and has a protruding side which is formed by partially surrounding the bottle neck of the fin structure, and a bottom side in direct contact with the substrate so that the protruding side extend to and under the fin structure. The gate structure partially surrounds the fin structure.

20 Claims, 7 Drawing Sheets

FINFET TRANSISTOR STRUCTURE AND METHOD FOR MAKING THE SAME

BACKGROUND OF THE INVENTION

1. Field of the Invention

The present invention generally relates to a FINFET transistor structure and a method for forming various FINFET transistor structures. In particular, the present invention is directed to a method for forming various FINFET transistor structures by different possibilities of formation of oxide layers to reduce the leak current of the FINFET transistor structure or to maintain the heat-dissipating of the FINFET transistor structure.

2. Description of the Prior Art

One of the purposes of the development of the semiconductor industry is to enhance the efficiency of the semiconductor devices and to reduce the energy consumption of the semiconductor devices. When it comes to enhancing the efficiency of the semiconductor devices, it is already known in the prior art that different lattice structures may facilitate the mobility of the electrons or the holes.

For example, a higher carrier mobility can be observed when a metal-oxide-semiconductor (MOS) is constructed on an n-channel of a (100) lattice of Si, and similarly a higher carrier mobility can be observed when a metal-oxide-semiconductor (MOS) is constructed on a P-channel of a (110) lattice of Si. As a result, when a planar complementary MOS is constructed, Si of different lattices is formed together to get a substrate so that MOS of n-channel is constructed on a (100) lattice, and MOS of P-channel is constructed on a (110) lattice to get a better performance.

However, as the critical dimension of the devices shrinks, in particular for the generations after 65 nm, the multi-gate devices such as a fin field effect transistor (FinFET) is proposed to replace the planar complementary MOS since it is getting harder and harder to reduce the physical dimension of the conventional planar complementary MOS. However, in one aspect, because some of the bottom of the fin field effect transistor is directly connected to the substrate, inevitable leak current is always a serious problem. In another aspect, should the fin field effect transistor be constructed on an SOI substrate to solve the problem of inevitable leak current, another problem arises because of a higher production cost due to much more expensive SOI substrates.

Given the above, a novel method for forming a FINFET transistor structure as well as a novel FINFET transistor structure are still needed to bring a resolution to the dilemma.

SUMMARY OF THE INVENTION

The present invention accordingly proposes a method for forming various FINFET transistor structures to obtain various FINFET transistor structures to meet various demands. The present invention utilizes the different possibilities for forming oxide to construct FINFET transistors of different structures. In one aspect, there is no need to use the expensive SOI substrate and a FINFET transistor structure disposed on an insulating layer can still be formed. Moreover it is characterized that at least one of the top side and the bottom side of the insulating layer is uneven. In another aspect, the present invention also proposes a FINFET transistor structure with a bottle neck directly connected to the substrate. The bottle neck is capable of lowering the leak current of the FINFET transistor structure without reducing the heat-dissipating ability of the FINFET transistor structure.

The present invention in a first aspect proposes a FINFET transistor structure. The FINFET transistor structure of the present invention includes a substrate, a fin structure, an insulating layer and a gate structure. The insulating layer covers the substrate and has a top side and a bottom side in direct contact with the substrate. At least one of the top side and the bottom side is uneven. The fin structure is disposed on the insulating layer and includes a fin conductive layer and a source/drain. The gate structure partially surrounds the fin structure and includes a gate conductive layer and a gate dielectric layer.

In one embodiment of the present invention, the insulating layer includes a plurality of U-shape bottoms so that the fin structure is disposed between the adjacent U-shape bottoms. In another embodiment of the present invention, the FINFET transistor structure includes a cap layer covering the fin conductive layer. In still another embodiment of the present invention, the fin structure includes a rounded corner. In yet another embodiment of the present invention, the insulating layer is substantially stress free.

The present invention in a second aspect proposes a FINFET transistor structure. The FINFET transistor structure of the present invention includes a substrate, a fin structure, an insulating layer and a gate structure. The fin structure includes a fin conductive layer and a bottle neck. The insulating layer covers the substrate and has a protruding side which is formed by partially surrounding the bottle neck of the fin structure, and a bottom side in direct contact with the substrate. The protruding side extends to and under the fin structure. The gate structure partially surrounds the fin structure and includes a gate conductive layer and a gate dielectric layer.

In one embodiment of the present invention, the FINFET transistor structure further includes a shallow trench isolation disposed under the insulating layer. The shallow trench isolation has a top side in direct contact with the insulating layer, and the bottom side of the insulating layer is larger than the top side of the shallow trench isolation.

The present invention in a third aspect proposes a method for forming a FINFET transistor structure. First, a substrate and a fin structure disposed on the substrate are provided. The fin structure includes a mask layer, a buffer layer, a cap layer, a fin conductive layer and a spacer surrounding the mask layer, the buffer layer, the cap layer and the fin conductive layer. Second, a substrate etching step including a vertical etching step and a lateral etching step is carried out to form a first recess and a second recess connecting to the first recess in the substrate. At least one of the first recess and the second recess has a protruding side extending to and under the fin structure. Later, an oxide is formed to fill the first recess and the second recess. Then, a gate structure is formed to partially surround the fin structure.

In one embodiment of the present invention, the vertical etching step may be carried out before or after the lateral etching step. In another embodiment of the present invention, a furnace oxidation procedure may be used to oxidize the substrate to form the needed oxide. In still another embodiment of the present invention, the lateral etching step forms the bottle neck in the fin structure. In yet another embodiment of the present invention, a width of the bottle neck is 40%-60% of that of the fin structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
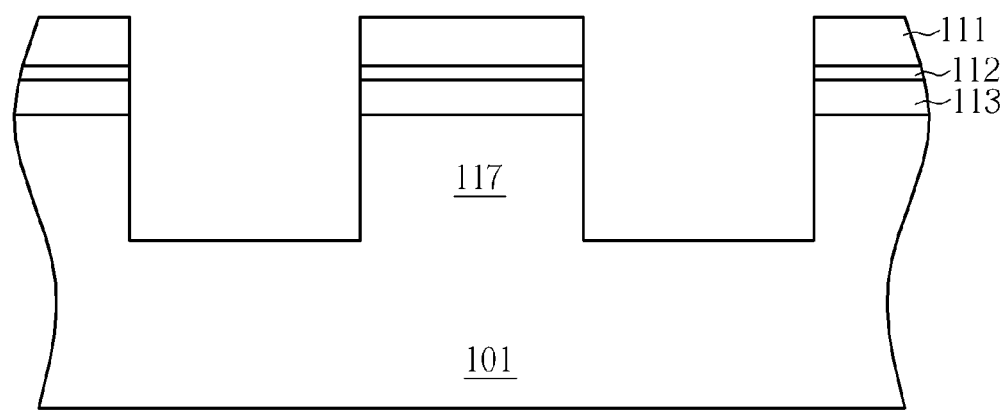
FIGS. 1-8B illustrate the method for forming various FINFET transistor structures to obtain various FINFET transistor structures of the present invention.

The present invention provides a novel method for forming various FINFET transistor structures to obtain various FINFET transistor structures to meet various demands. In the method of the present invention, the procedures for forming the oxide may be different, so FINFET transistors of different structures may be constructed. In one aspect, there is no need to use expensive SOI substrate, and a FINFET transistor structure disposed on an insulating layer can still be formed. Moreover it is characterized that at least one of the top side and the bottom side of the insulating layer is uneven. In another aspect, the present invention also proposes a FINFET transistor structure with a bottle neck directly connected to the substrate. The bottle neck lowers the leak current of the FINFET transistor structure without reducing the heat-dissipating ability of the FINFET transistor structure.

FIGS. 1-8B illustrate the method for forming various FINFET transistor structures to obtain various FINFET transistor structures of the present invention. First please refer to FIG. 3, a substrate 101 and at least a fin structure 110 disposed on the substrate 110 are provided. The fin structure 110 includes a mask layer 111, a buffer layer 112, a cap layer 113, a fin conductive layer 117 and a spacer 114.

The fin structure 110 may be formed as follows. First, as shown in FIG. 1, a mask layer 111, a buffer layer 112 and a cap layer 113 are provided on the substrate 101. The cap layer 113 may include silicon oxynitride and blanket deposited on the substrate 101 by deposition. The buffer layer 112 including silicon oxide is formed on the cap layer 113 by deposition. A patterned mask layer 111 is formed on the buffer layer 112 so that the mask layer 111 has a pattern to define the fin structure 110. The mask layer 111 may be a hard mask, such as a hard mask including silicon nitride. The method for forming the patterned mask layer 111 may be the pattern on a pre-patterned photoresist (not shown) is transferred to the mask layer 111 by etching.

Second, as shown in FIG. 1, the patterned mask layer 111 is used as an etching mask to carry out a fin structure etching step. The fin structure etching step partially removes the buffer layer 112, the cap layer 113 and the substrate 101 to roughly define the profile of the fin structure 110. Some of the substrate 101 below the cap layer 113 becomes a fin conductive layer 117. A dry etching may be used to carry out the fin structure etching step. For example, the buffer layer 112 and the cap layer 113 are etched by $CF_4$, $O_2$ and He. Besides, the substrate 101 is etched by HBr, $O_2$ and He.

Figure 2:
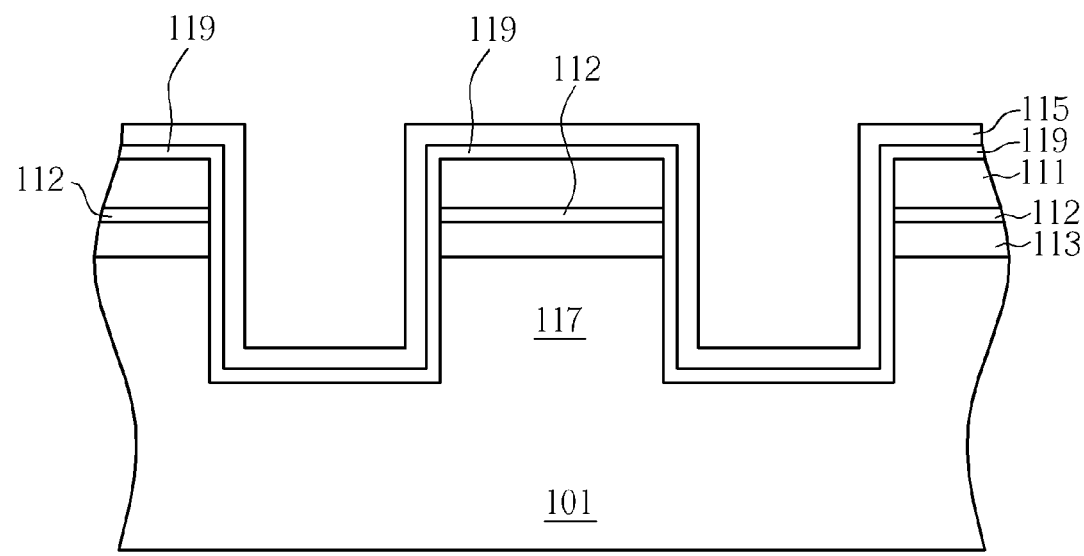

Then as shown in FIG. 2, a spacer material layer 115 is formed on the mask layer 111, the buffer layer 112, the cap layer 113 and the substrate 101 to cover the previously formed material layers and the fin conductive layer 117. The spacer material layer 115 may include silicon nitride. Optionally, before the spacer material layer 115 is deposited, another buffer layer 119 of silicon oxide may be formed in advance so that the buffer layer 119 becomes a second spacer material layer and the spacer material layer 115 becomes a first spacer material layer.

Figure 3:
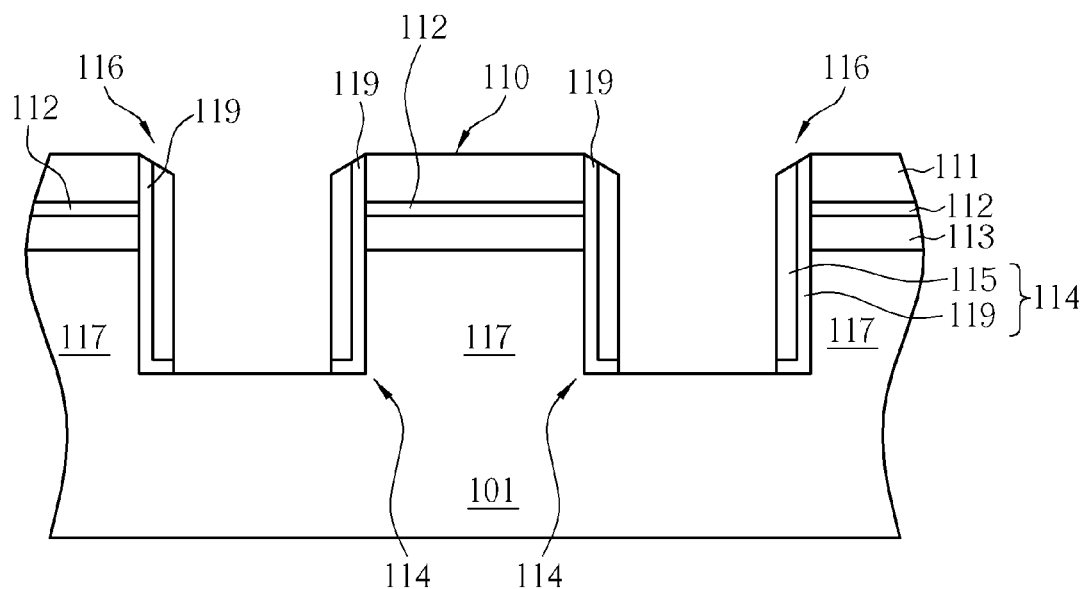

Then, as shown in FIG. 3, a side wall etching step is carried out to partially remove the spacer material layer 115 and the optional buffer layer 119. At last, a spacer 114 is obtained to protect the fin conductive layer 117 and the resultant fin structure 110. In other words, the spacer 114 may include the spacer material layer 115 and the optional buffer layer 119. In addition, the spacer 114 may surround the mask layer 111, the buffer layer 112, the cap layer 113 and the fin conductive layer 117. The side wall etching step may also remove some of the fin structure 110 to form a rounded corner 116.

Figure 4:
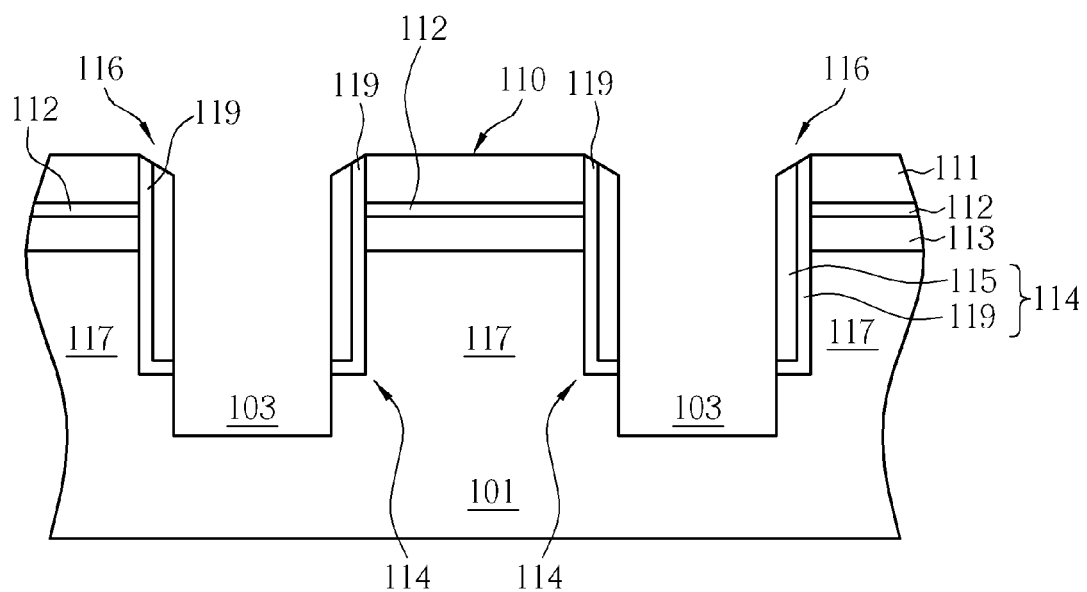
Figure 5:
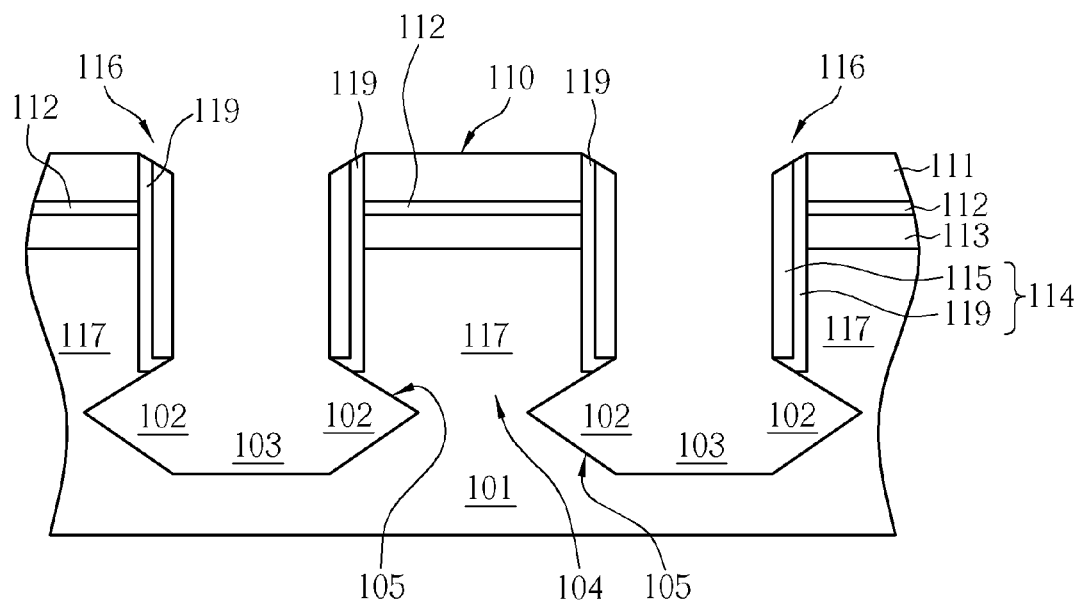

Continuing, as shown in FIGS. 4 and 5, the mask layer 111 and the spacer 114 are used as the etching masks to carry out a substrate etching step to form a first recess 103 and a second recess 102 connecting to the first recess 103 in the substrate 101. The positions of the first recess 103 and the second recess 102 are relative, for example, the second recess 102 surrounds the first recess 103. The substrate etching step to form the first recess 103 and the second recess 102 is not a single etching procedure, and usually includes multiple etching procedures, to respectively construct the needed first recess 103 and second recess 102.

For example, the substrate etching step may include at least one vertical etching step and at least one lateral etching step. Since the order of the vertical etching step and the lateral etching step of the present invention is not crucial, one of the vertical etching step and the lateral etching step is first carried out then the other one is carried out for example.

Figure 5A:
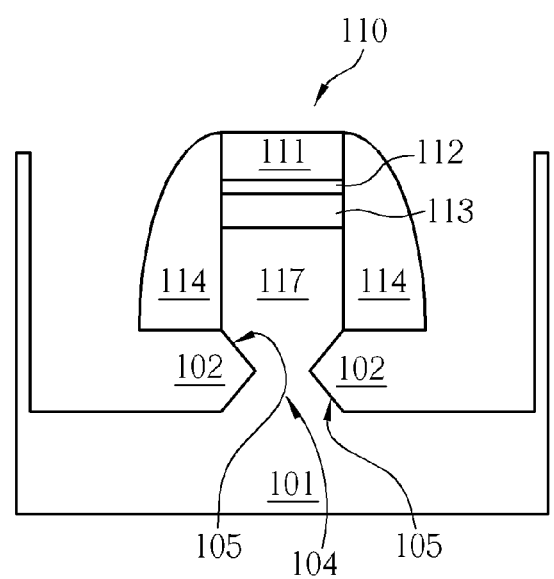
Figure 6A:
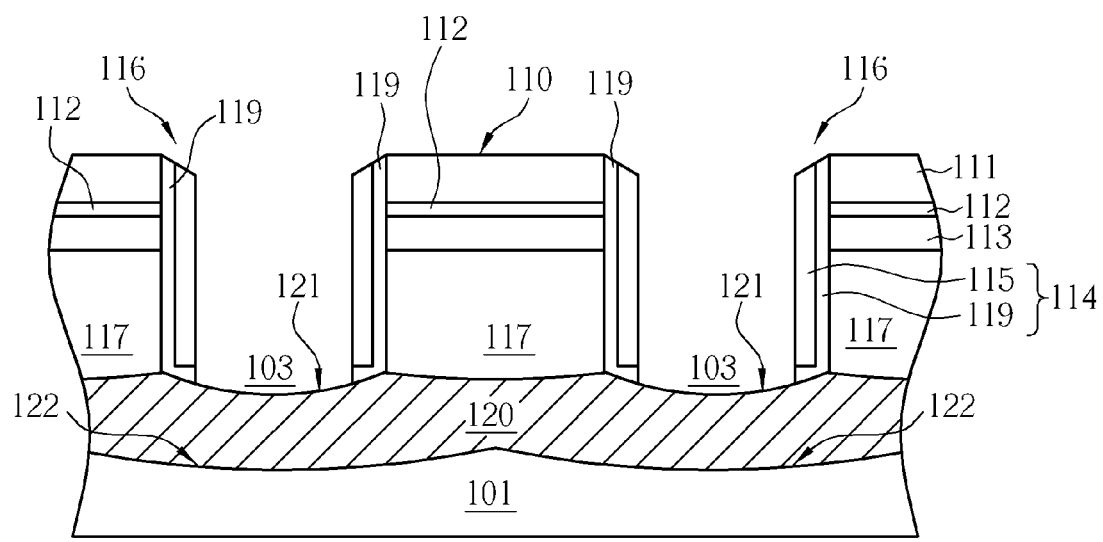
Figure 6B:
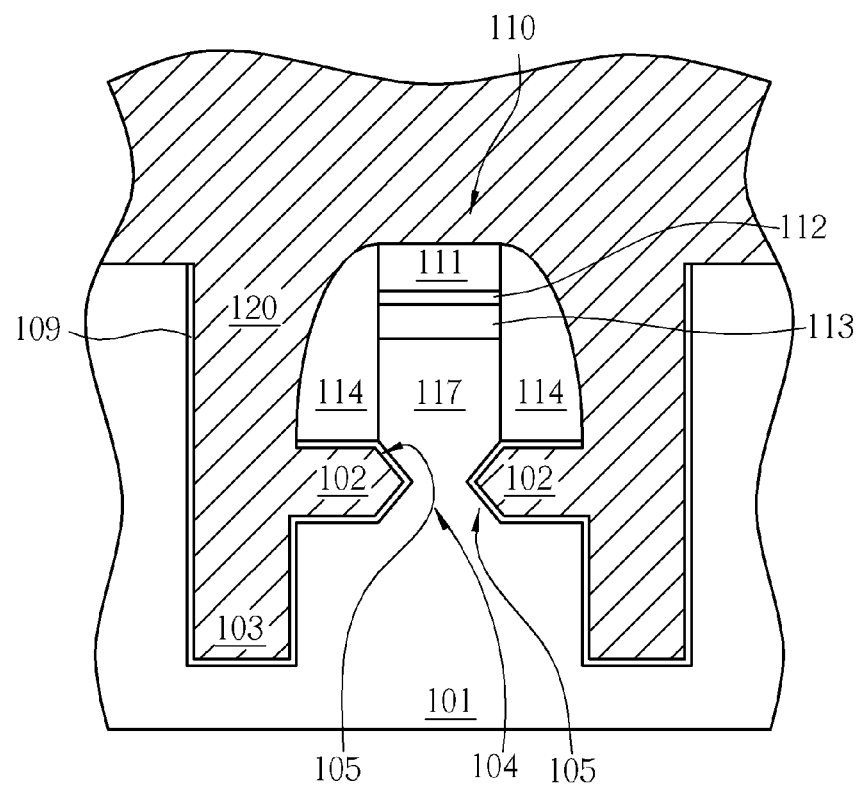

In one embodiment as shown in FIG. 4, the vertical etching step is first carried out to construct the first recess 103. For example, a dry etching such as $SF_6$ and He is used to remove some exposed substrate 101 to construct the first recess 103 of a needed size, for example, 5 nm~100 nm deeper from the spacer 114. Later, as shown in FIG. 5, a dry etching alone or in combination with a wet etching may be used to carry out the vertical etching step to form the needed second recess 102 and simultaneously to form a bottle neck 104 under the fin structure 110. For example, the dry etching may be $SF_6$ and He to remove the substrate 101 and the wet etching may be aqueous $NH_3$ and low concentration $H_2O_2$ to remove the substrate 101. Please note that the second recess 102 is preferably in a wedge shape, that is, a protruding side 105 extends to and under the fin structure 110 by etching along a certain Si lattice. Of course, the lateral etching step may be carried out first, as shown in FIG. 5A in combination with FIG. 6B. Optionally, the bottle neck 104 may have a width between 3 μm-10 μm, or the width of the bottle neck 104 may be 40%-60% of that of the fin structure 110.

Next, an oxide layer to fill the first recess 103 and the second recess 102 is about to be formed. There may be different approaches to form the oxide layer. Different approaches may make the resultant oxide layer structurally different so that the final FINFET transistor structures are accordingly different, too.

In a first embodiment of the present invention, an oxide layer which fully supports the fin structure 110 is formed. Please refer to FIG. 6A, after the needed first recess 103 and second recess 102 are done, an oxidization procedure may be used to form the oxide layer 120 which fully supports the fin structure 110. For example, a furnace oxidation procedure is used to oxidize the exposed substrate 101, that is to oxidize the Si atoms in the substrate 101 near the fin structure 110, the first recess 103 and the second recess 102, to form a bulk oxide 120 including silicon oxide and serve as a field oxide to segregate the substrate 101 and the fin structure 110. The thickness of the bulk oxide layer 120 may be 10 nm~200 nm and the bottle neck 104 vanishes because of the destructive oxidation procedure.

Owing to the introduction of oxygen atoms, the oxide layer 120 fills up the second recess 102 and occupies most of the first recess 103 so the first recess 103 barely remains. In addition, due to the direct oxidation of Si atoms, the oxide layer 120 is supposed to have a not even top side 121 and a not even bottom side 122, so it is different from what is formed by deposition. The oxide layer 120 is substantially stress free.

Figure 7A:
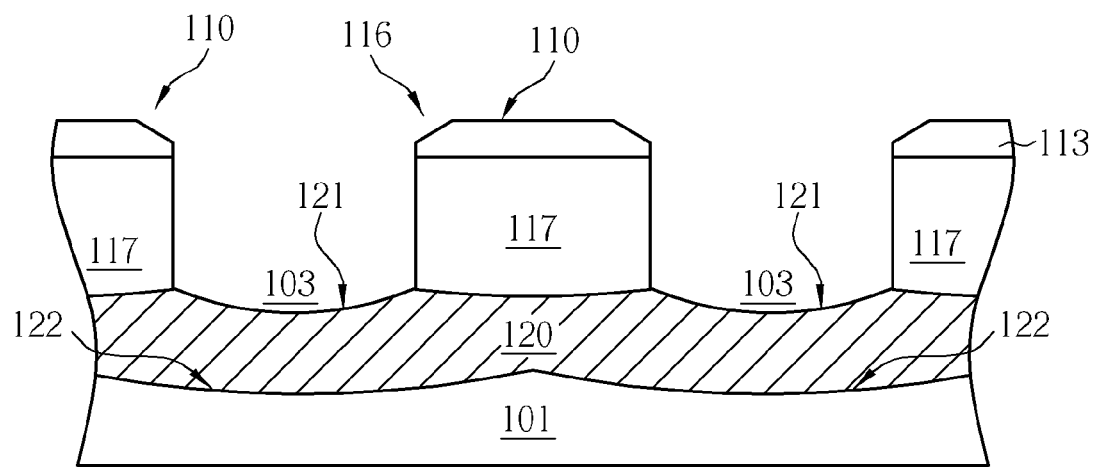

Because the spacer 114, the mask layer 111 and the buffer layer 112 are used to protect the fin structure 110 from being damaged by the etching or the oxidizing procedures, the spacer 114, the mask layer 111 and the buffer layer 112 are ready to be removed after the etching or the oxidizing procedures are done, as shown in FIG. 7A. For example, the spacer 114 may be removed by wet etching. If the spacer 114 includes the first spacer material layer and the second spacer material layer, removing the spacer 114 means simultaneously removing the first spacer material layer and the second spacer material layer.

In a second embodiment of the present invention, an oxide layer which fully covers the fin structure 110 is formed. Please refer to FIG. 6B, after the needed first recess 103 and second recess 102 are done, a deposition procedure may be used to form the oxide layer 120 which fully covers the fin structure 110 and fully fills up the first recess 103 and second recess 102 without oxidizing the Si atoms in the substrate 101.

For example, a spin-on dielectric (SOD) which coats a layer of liquid containing silicon oxide on the wafer surface and/or a deposition procedure is used to form the oxide layer 120 which fully covers the fin structure 110, the first recess 103 and second recess 102 so that the insulating layer 120 may include silicon oxide or silicon oxynitride. SOD fills the gap to exhibit good coverage. A thermo annealing is carried out on the liquid to transform it to a solid oxide layer. Please note that the fin structure 110 is still directly connected to the substrate 101 because no Si atoms are oxidized. Optionally, a pad layer 109 may be formed on the inner walls of the first recess 103 and second recess 102 in advance before the insulating layer 120 is formed. The pad layer 109 may be formed by oxidizing the substrate 101. The pad layer 109 may be useful in smoothing the roughened surface of the substrate 101 and additionally repair the lattice structure to reduce the leak current.

Figure 7B:
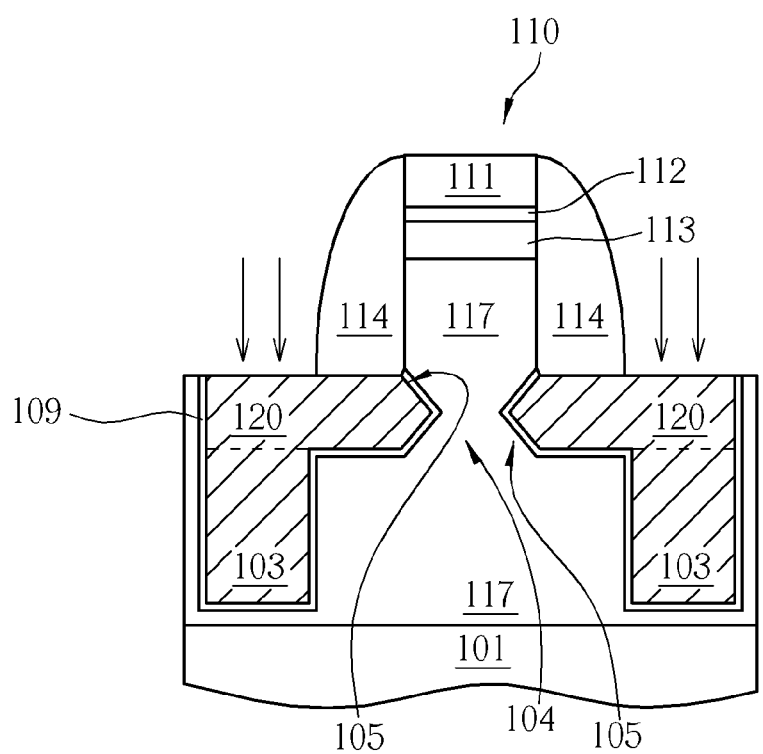

Later, please refer to FIG. 7B, a CMP and a pull back step may be used to reduce some of the oxide layer 120 by process control, so that the outer surface of the oxide layer 120 and the bottom of the spacer 114 directly but barely align with each other. The oxide layer 120 just fills up the first recess 103 and second recess 102 but completely exposes the fin structure 110. The pull back etching may be carried out by a dry etching such as $CF_4+O_2$ and Ar, wet etching such as dilute HF. Because the oxide layer 120 which fills up the first recess 103 is deep in the substrate 101, it may be deemed as the common shallow trench isolation.

Because the spacer 114, the mask layer 111 and the buffer layer 112 are used to protect the fin structure 110 from being damaged by the etching or oxidizing procedures, the spacer 114, the mask layer 111 and the buffer layer 112 are ready to be removed after the etching or oxidizing procedures are done, as shown in FIG. 7A. For example, the spacer 114 may be removed by wet etching. If the spacer 114 includes the first spacer material layer and the second spacer material layer, removing the spacer 114 means simultaneously removing the first spacer material layer and the second spacer material layer.

Figure 8A:
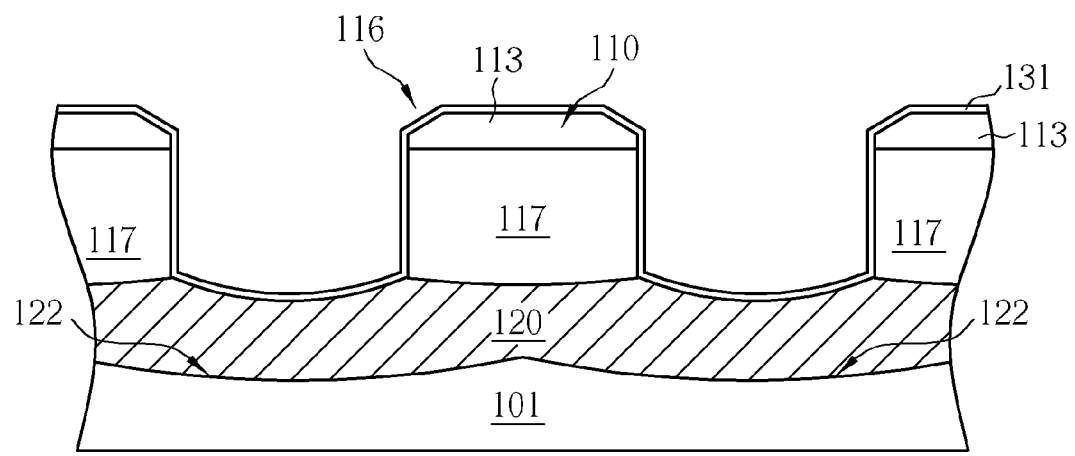
Figure 8B:
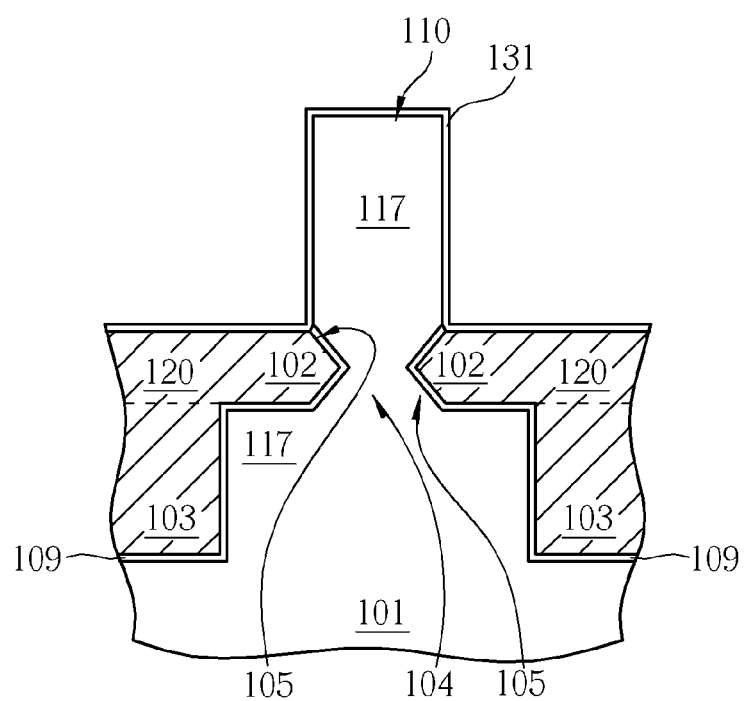

After the above formation of the oxide layer and different oxide layers 120 are resultantly formed, the following steps for the formation of the gate are still universal. After the spacer 114 is removed, the needed gate dielectric layer 131 is formed. The former structure as illustrated in FIG. 7A now becomes the structure as illustrated in FIG. 8A. Or optionally, the cap layer 113 may be removed in advance, so the former structure as illustrated in FIG. 7B now becomes the structure as illustrated in FIG. 8B. The gate dielectric layer 131 may be a regular dielectric material, such as a silicon oxide of high quality, or a high-k material $HfO_2$ or $HfZrO_2$ or $ZrO_2$ or $BaTiO_3$ or $Al_2O_3$ or $Ta_2O_5$ or $La_2O_3$ or $Pr_2O_3$. The procedures for the gate dielectric layer 121 are well known to persons of ordinary skills in the art and the details will not be described here.

Figure 9A:
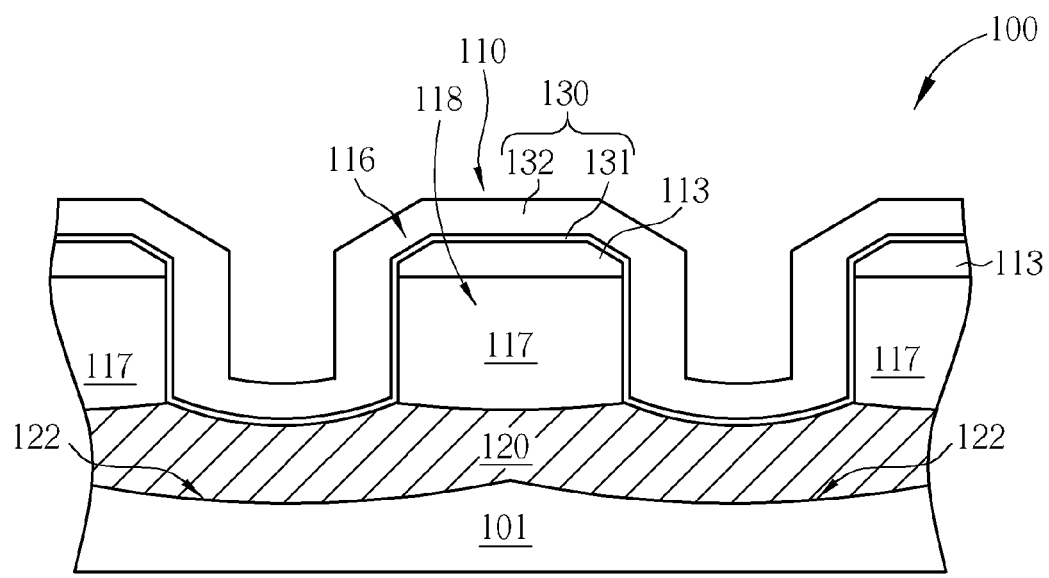
FIG. 9A illustrates a FINFET transistor structure of the present invention.
Figure 9B:
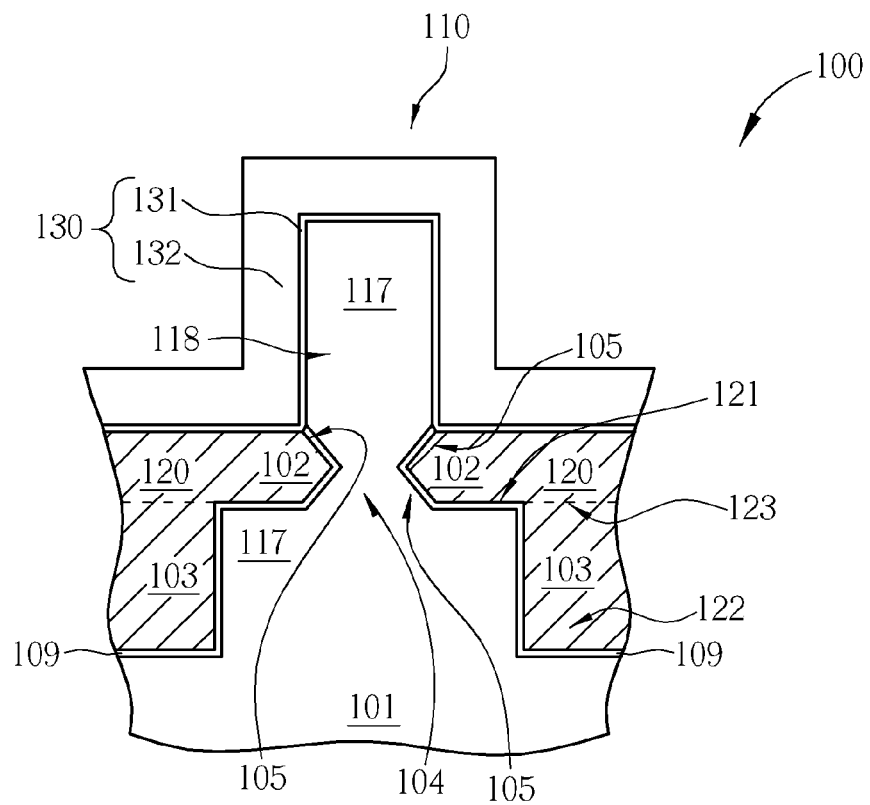
FIG. 9B illustrates another FINFET transistor structure of the present invention.

Later, a gate structure 130 disposed on the fin structure 110 and controlling the fin structure 110 is formed. For either the structure as illustrated in FIG. 8A or the structure as illustrated in FIG. 8B, a gate structure 130 can still be formed, so that the structure as illustrated in FIG. 8A becomes a FINFET transistor structure 100 as illustrated in FIG. 9A or the structure as illustrated in FIG. 8B becomes a FINFET transistor structure 100 as illustrated in FIG. 9B.

For example, a gate material layer 132 is completely deposited on the gate dielectric layer 131 and then an etching procedure is used to define the gate structure 130. If the cap layer 113 remains, the gate dielectric layer 131 is in direct contact with the cap layer 113. If the cap layer 113 is removed, the gate dielectric layer 131 directly surrounds the fin structure 110. At least, the patterned gate dielectric layer 131 and the gate material layer 132 together form the gate structure 130, and the methods for forming various FINFET transistor structures of the present invention are as described.

The methods for forming various FINFET transistor structures of the present invention may obtain at least two FINFET transistor structures. First, as shown in FIG. 9A, in a first embodiment of the present invention, a FINFET transistor structure 100 is provided. The FINFET transistor structure 100 of the present invention includes a substrate 101, a fin structure 110, an insulating layer 120 and a gate structure 130. The substrate 101 is usually a semiconductive material, such as Si and can be oxidized to form silicon oxide in a suitable condition. The insulating layer 120 is made by directly oxidizing the Si atoms in the substrate 101, so a bulky insulating layer 120 directly covers the substrate 101. As a result, the expensive SOI substrate is no longer needed in the FINFET transistor structure 100 of the present invention so it is advantageous in production cost.

The insulating layer 120 itself has a top side 121 and a bottom side 122 in direct contact with the substrate 101. Because the insulating layer 120 is made by directly oxidizing the Si atoms in the substrate 101, at least one of the top side 121 and the bottom side 122 is uneven. For example, the insulating layer 120 includes a plurality of U-shape bottoms 122 so it is absolutely different from a flat surface (not shown) made by deposition procedure. Further, the insulating layer 120 is substantially stress free.

The fin structure 110 is disposed on the insulating layer 120 and includes a fin conductive layer 117 and a source/drain 118 disposed at two sides of the fin conductive layer 117. Preferably, the top of the fin structure 110 includes a rounded corner 116. In the FINFET transistor structure 100 of the present invention, there may be more than one fin structure 110 so the fin structure 110 may be disposed between two adjacent U-shape bottoms 122. The fin conductive layer 117 in the fin structure 110 is originally part of the substrate 101 but it separates from the substrate 101 completely due to the segregation of the insulating layer 120. Optionally, there may be a cap layer 113, such as silicon oxynitride, covering the fin conductive layer 117 in the fin structure 110.

The gate structure 130 surrounds the fin structure 110 in three directions and includes a gate conductive layer 132 and a gate dielectric layer 131. The extending gate structure 130 is usually in a form of U-shape to control multiple fin structures 110 at the same time. The gate structure 130 controls the fin structure 110 in three directions if the cap layer 113 is removed. The gate structure 130 controls the fin structure 110 in two directions if the cap layer 113 remains.

As shown in FIG. 9B, in a second embodiment of the present invention, another FINFET transistor structure 100 is provided. The FINFET transistor structure 100 of the present invention includes a substrate 101, a fin structure 110, an insulating layer 120 and a gate structure 130. The substrate 101 is usually a semiconductive material, such as Si. Preferably, the top of the fin structure 110 includes a rounded corner 116. Optionally, there may be a cap layer such as silicon oxynitride, covering the fin conductive layer 117 in the fin structure 110. The gate structure 130 controls the fin structure 110 in three directions if the cap layer 113 is removed. The gate structure 130 controls the fin structure 110 in two directions if the cap layer 113 remains.

The differences between the first embodiment and the second embodiment of the present invention at least resides in that the oxide layer 120 is formed by deposition procedure to be around the fin structure 110 and disposed in the first recess 103 and second recess 102 without entirely covering the substrate 101. The insulating layer 120 may include silicon oxide or silicon oxynitride. As shown in FIG. 5, the second recess 102 is preferably in a wedge shape and a protruding side 105 extends to and under the fin structure 110 to form a bottle neck 104 in the fin structure 110.

The fin structure 110 is directly connected to the substrate 101 by the bottle neck 104, which dissipates heat and reduces leak current as well. Optionally, the bottle neck 104 may have a width between 3 μm-10 μm, or the width of the bottle neck 104 may be 40%-60% of that of the fin structure 110. Further, the FINFET transistor structure 100 in the second embodiment of the present invention includes a pad layer 109 disposed between the shallow trench isolation 122 and the substrate 101 as well as between the insulating layer 120 and the fin structure 110.

The oxide layer 120 which fills up the first recess 103 and second recess 102 not only covers the substrate 101 but also has a protruding side 105 partially surrounding the bottle neck 104 of the fin structure 110 and a bottom 122 in direct contact with the substrate. The protruding side 105 extends to and under the fin structure 110.

Because the filled first recess 103 is deep inside the substrate 101, it may also serve as deemed as common shallow trench isolation 122 under the insulating layer 120 filling up the second recess 102. The shallow trench isolation 122 has a top side 123 in direct contact with the insulating layer 120 and the bottom side 121 of the insulating layer 120 is larger than the top side 123 of the shallow trench isolation 122.

Those skilled in the art will readily observe that numerous modifications and alterations of the device and method may be made while retaining the teachings of the invention.

What is claimed is:

1. A method for forming a FINFET transistor structure, comprising:
    providing a substrate and a fin structure disposed on said substrate, wherein said fin structure comprises a mask layer, a buffer layer, a cap layer, a fin conductive layer and a spacer surrounding said mask layer, said buffer layer, said cap layer and said fin conductive layer;
    performing a substrate etching step comprising a vertical etching step and a lateral etching step to form a first recess and a second recess connecting to said first recess in said substrate, wherein said second recess has a protruding side extending to and under said fin structure;
    forming an oxide to fill said first recess and said second recess;
    removing said spacer after said oxide filling up said first recess and said second recess; and
    forming a gate structure comprising a gate dielectric layer and a gate material layer, said gate structure partially surrounding said fin structure, wherein said gate dielectric layer is disposed outside of said second recess.

2. The method for forming a FINFET transistor structure of claim 1, wherein said vertical etching step is performed before said lateral etching step.

3. The method for forming a FINFET transistor structure of claim 1, wherein said vertical etching step is performed after said lateral etching step.

4. The method for forming a FINFET transistor structure of claim 1, wherein forming said fin structure comprises:
    providing said substrate, said cap layer disposed on said substrate, said buffer layer disposed on said cap layer and said mask layer disposed on said buffer layer;
    using said mask layer as an etching mask to perform a fin structure etching step to partially remove said buffer layer, said cap layer and said substrate;
    forming a spacer material layer to completely cover said mask layer, said buffer layer, said cap layer and said substrate; and
    performing a side wall etching step to partially remove said spacer material layer to obtain said side wall.

5. The method for forming a FINFET transistor structure of claim 4, wherein said spacer material layer comprises a first spacer material layer and a second spacer material layer.

6. The method for forming a FINFET transistor structure of claim 4, wherein said fin structure etching step comprises a dry etching step.

7. The method for forming a FINFET transistor structure of claim 6, wherein said fin structure etching step further comprises a wet etching step.

8. The method for forming a FINFET transistor structure of claim 1, wherein a dry etching is used to perform said vertical etching step.

9. The method for forming a FINFET transistor structure of claim 1, wherein said lateral etching step comprises a dry etching step.

10. The method for forming a FINFET transistor structure of claim 9, wherein said lateral etching step further comprises a wet etching step.

11. The method for forming a FINFET transistor structure of claim 1, wherein a furnace oxidation procedure is used to oxidize said substrate to form said oxide and said oxide becomes a field oxide to segregate said substrate and said fin structure.

12. The method for forming a FINFET transistor structure of claim 11, further comprising:
    removing said spacer by a wet etching after forming said oxide.

13. The method for forming a FINFET transistor structure of claim 1, wherein said vertical etching step forms a first recess for use as a shallow trench isolation.

14. The method for forming a FINFET transistor structure of claim 1, wherein said lateral etching step forms a bottle neck in said fin structure.

15. The method for forming a FINFET transistor structure of claim 14, wherein said bottle neck has a width between 3 μm-10 μm.

16. The method for forming a FINFET transistor structure of claim 14, wherein a width of said bottle neck is 40%-60% of that of said fin structure.

17. The method for forming a FINFET transistor structure of claim 1, further comprising:
  oxidizing said substrate to form a pad layer disposed on the sidewall of said first recess and said second recess.

18. The method for forming a FINFET transistor structure of claim 17, further comprising:
  covering said fin structure comprising said sidewall by using said oxide; and
  partially removing said oxide so that the outer surface of said oxide is in direct contact with the bottom of said spacer.

19. The method for forming a FINFET transistor structure of claim 1, further comprising:
  removing said mask layer and said buffer layer so that said gate dielectric layer is in direct contact with said cap layer.

20. The method for forming a FINFET transistor structure of claim 1, further comprising:
  removing said cap layer.

* * * * *